United States Patent
Dydyk et al.

[11] Patent Number: 5,481,231
[45] Date of Patent: Jan. 2, 1996

[54] LUMPED ELEMENT FOUR PORT COUPLER

[75] Inventors: Michael Dydyk, Scottsdale; Craig E. Lindberg, Chandler, both of Ariz.

[73] Assignee: Motorola, Inc., Schaumburg, Ill.

[21] Appl. No.: 262,811

[22] Filed: Jun. 21, 1994

[51] Int. Cl.⁶ .................... H01P 5/16; H01P 5/19
[52] U.S. Cl. ................ 333/112; 333/118; 333/161
[58] Field of Search ........................ 333/112, 118

[56] References Cited

U.S. PATENT DOCUMENTS

| | | | |
|---|---|---|---|
| H954 | 8/1991 | Lang et al. | 333/164 |
| 3,484,724 | 12/1969 | Podell | 333/112 |
| 3,781,718 | 12/1973 | Gittinger | 333/118 |
| 4,398,161 | 8/1983 | Lamb et al. | 333/156 |
| 4,556,856 | 12/1985 | Presser | 333/124 |
| 4,612,520 | 9/1986 | Boire et al. | 333/156 |
| 4,638,190 | 1/1987 | Hwang et al. | 307/512 |
| 4,893,098 | 1/1990 | Seely et al. | 333/112 |
| 4,994,773 | 2/1991 | Chen et al. | 333/164 |
| 5,081,432 | 1/1992 | Devlin et al. | 323/103 |
| 5,128,638 | 7/1992 | Staudinger et al. | 333/118 X |
| 5,166,648 | 11/1992 | Wen et al. | 333/139 |
| 5,175,517 | 12/1992 | Dydyk et al. | 333/118 |
| 5,180,998 | 1/1993 | Wilems | 333/164 |
| 5,304,961 | 4/1994 | Dydyk | 333/112 |

FOREIGN PATENT DOCUMENTS 57-68917  4/1982  Japan .
63-43412  2/1988  Japan .

OTHER PUBLICATIONS

"A Lumped Element Rat Race Coupler" from Applied Microwave, by Samuel J. Parisi, MITRE Corp., Bedford, Massachusetts, Aug./Sep. 1989.

"A Monolithic Image–Rejection Mixer On GaAs Using Lumped Elements*" by John Putnam and Richard Puente, M/A–Com Advanced Semiconductor Opertions, Lowell, Mass., from Microwave Journel, Nov. 1987.

*Primary Examiner*—Paul Gensler
*Attorney, Agent, or Firm*—Frederick M. Fliegel

[57] ABSTRACT

A four port coupler includes a first port adapted to impedance match to a first impedance $Z_o$, a second port adapted to impedance match to a second impedance $Z_1$ different than the first impedance, a third port adapted to impedance match to the first impedance and a fourth port adapted to impedance match to the second impedance.

10 Claims, 3 Drawing Sheets

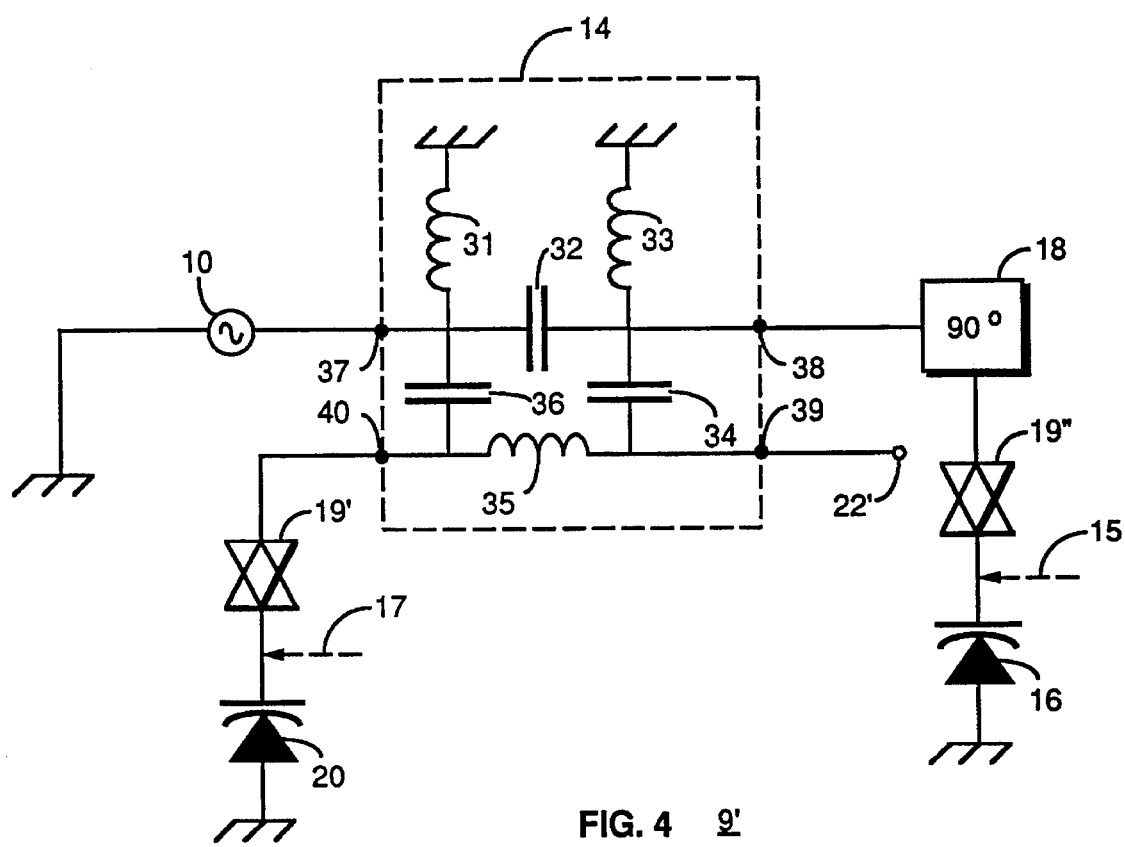
FIG. 4  9'

1

LUMPED ELEMENT FOUR PORT COUPLER

CROSS-REFERENCE TO RELATED APPLICATIONS

This application is related to co-pending U.S. patent application Ser. Nos. 08/263,226 and 08/263,324, filed concurrently herewith, which are assigned to the same assignee as the present application.

1. Field of the Invention

This invention relates in general to the field of four port couplers, more specifically to four port couplers employing lumped elements and more particularly to four port couplers adapted to impedance match to first and second impedances.

2. Background of the Invention

Increasing demands for small size, light weight and high efficiency have led to implementation of many radio frequency functions through monolithic microwave integrated circuitry (MMICs), typically fabricated as a gallium arsenide chip. Lumped element realizations of transmission line circuits are particularly well adapted to MMIC media.

Four port couplers find application in a variety of electronic devices such as modulators, signal combiners and communications systems. Conventional four port couplers are realized as a plurality of transmission line segments combined together to provide specific phase shifts between adjacent ports over a first desired bandwidth. These types of couplers may be larger than ideal, are difficult to realize in monolithic form at some frequencies and, when constructed employing discrete components, require matching of the various constituent components one to another which may be tedious and/or time consuming.

Moreover, these types of four port couplers are typically designed to be impedance matched to a single impedance at all four ports. This may be undesirable in some applications because these applications may then require additional components and their attendant losses in order to provide an approximation to the desired circuit performance.

Thus, what is needed is a practical, economical apparatus and accompanying method for providing four port couplers adapted to be impedance matched to a first impedance at a first port and to a second impedance at a second port, in compact form having low power dissipation and providing robust performance over a broad range of operating conditions.

SUMMARY OF THE INVENTION

A four port coupler includes a first port adapted to impedance match to a first impedance $Z_o$, a second port adapted to impedance match to a second impedance $Z_1$ different than the first impedance, a third port adapted to impedance match to the first impedance and a fourth port adapted to impedance match to the second impedance.

In a first embodiment, the coupler desirably but not essentially includes a first inductor having a first lead coupled to the first port and a second lead coupled to ground, a first capacitor having a first lead coupled to the first port and a second lead coupled to the second port, a second inductor having a first lead coupled to the second port and a second lead coupled to ground, a second capacitor having a first lead coupled to the second port and a second lead coupled to the third port, a third inductor having a first lead coupled to the third port and a second lead coupled to the fourth port and a third capacitor having a first lead coupled to the first port and a second lead coupled to the fourth port.

In the first embodiment, the first, second and third capacitors each desirably but not essentially have a capacitance C given as $C=(2 \cdot Z_o \cdot Z_1)^{0.5} \omega_o$, where $\omega_o$ is a nominal center radian frequency of the coupler, the third inductor has an inductance L given as $L=(2 \cdot Z_o \cdot Z_1)^{0.5} \omega_o$, and the first and second inductors have inductances of one-half of the inductance L of the third inductor.

The coupler desirably is realized as a monolithic circuit.

In a second embodiment, the coupler desirably but not essentially includes a first inductor having a first lead coupled to the first port and a second lead coupled to the second port, a first capacitor having a first lead coupled to the first port and a second lead coupled to ground, a second capacitor having a first lead coupled to the second port and a second lead coupled to ground, a second inductor having a first lead coupled to the second port and a second lead coupled to the third port, a third capacitor having a first lead coupled to the third port and a second lead coupled to the fourth port and a third inductor having a first lead coupled to the fourth port and a second lead coupled to the first port.

In the second embodiment, the third capacitor desirably but not essentially has a capacitance C given as $C=(2 \cdot Z_o \cdot Z_1)^{-0.5} \omega_o$, where $\omega_o$ is a nominal center radian frequency of the coupler, the first and second capacitors have a capacitance of twice the capacitance C of the third capacitor and the first, second and third inductors have an inductance L given as $L=(2 \cdot Z_o \cdot Z_1)^{0.5}/\omega_o$.

A four port coupler includes a first port adapted to impedance match to a first impedance $Z_o$, a second port adapted to impedance match to a second impedance $Z_1$ different than the first impedance, a third port adapted to impedance match to the first impedance and a fourth port adapted to impedance match to the second impedance, wherein the four port coupler comprises a monolithic microwave integrated circuit. The first impedance $Z_o$ is desirably related to the second impedance $Z_1$ by a factor in the range of from one and one half to ten.

In one embodiment, the coupler desirably but not essentially includes a first spiral inductor having a first lead coupled to the first port and a second lead coupled to ground, a first capacitor having a first lead coupled to the first port and a second lead coupled to the second port, a second spiral inductor having a first lead coupled to the second port and a second lead coupled to ground, a second capacitor having a first lead coupled to the second port and a second lead coupled to the third port, a third spiral inductor having a first lead coupled to the third port and a second lead coupled to the fourth port and a third capacitor having a first lead coupled to the first port and a second lead coupled to the fourth port.

In this embodiment, the first, second and third capacitors each desirably but not essentially have a capacitance C given as $C=(2 \cdot Z_o \cdot Z_1)^{-0.5} \omega_o$, where $\omega_o$ is a nominal center radian frequency of the coupler, while the third spiral inductor desirably but not essentially has an inductance L given as $L=(2 \cdot Z_o \cdot Z_1)^{-0.5} \omega_o$, and the first and second spiral inductors desirably have inductances of one-half of the inductance L of the third spiral inductor.

In another embodiment, the coupler desirably includes a first spiral inductor having a first lead coupled to the first port and a second lead coupled to the second port, a first capacitor having a first lead coupled to the first port and a second lead coupled to ground, a second capacitor having a first lead coupled to the second port and a second lead coupled to ground, a second spiral inductor having a first lead coupled to the second port and a second lead coupled to the third port, a third capacitor having a first lead coupled to the third port and a second lead coupled to the fourth port and a third spiral inductor having a first lead coupled to the fourth port and a second lead coupled to the first port.

In this embodiment, the third capacitor desirably has a capacitance C given as $C=(2 \cdot Z_o \cdot Z_1)^{-0.5} \omega_o$, where $\omega_o$ is a nominal center radian frequency of the coupler, the first and second capacitors each have a capacitance of twice the capacitance C of the third capacitor and the first, second and third spiral inductors each have an inductance L given as $L=(2 \cdot Z_o \cdot Z_1)^{0.5} \omega_o$.

BRIEF DESCRIPTION OF THE DRAWING

FIG. 4 is a simplified schematic diagram of a second biphase modulator employing a four port coupler in accordance with the present invention.

DETAILED DESCRIPTION OF THE DRAWING

A useful description of a ring coupler circuit (not adapted to provide impedance matching to reactance elements) is provided in U.S. Pat. No. 5,175,517, entitled "Lumped Element Realization of Ring Hybrids Including π Circuit And Tank Circuit Means," issued to M. Dydyk, R. Keilmeyer and J. Lauchner on Dec. 29, 1992, which is hereby incorporated herein by reference.

Figure 1:
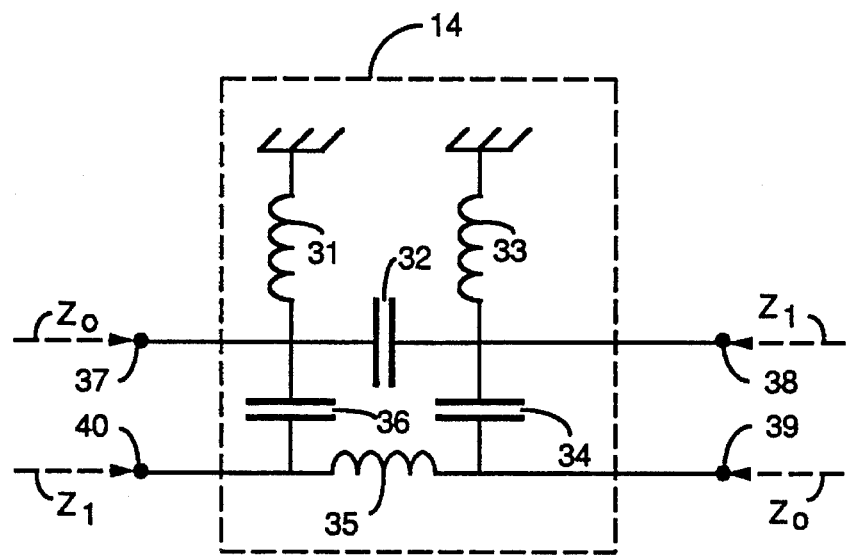
FIG. 1 is a schematic diagram of a first embodiment of a lumped element four port coupler in accordance with the present invention.

FIG. 1 is a schematic diagram of a first embodiment of lumped element four port coupler 14 in accordance with the present invention. Four port coupler 14 comprises first port 37 adapted to impedance match to first impedance $Z_o$, second port 38 adapted to impedance match to second impedance $Z_1$, third port 39 adapted to impedance match to first impedance $Z_o$ and fourth port 40 adapted to impedance match to second impedance $Z_1$.

Four port coupler 14 comprises first inductor 31 having a first lead coupled to first port 37 and a second lead coupled to ground, first capacitor 32 having a first lead coupled to first port 37 and a second lead coupled to second port 38, second inductor 33 having a first lead coupled to second port 38 and a second lead coupled to ground, second capacitor 34 having a first lead coupled to second port 38 and a second lead coupled to third port 39, third inductor 35 having a first lead coupled to third port 39 and a second lead coupled to fourth port 40 and third capacitor 36 having a first lead coupled to first port 37 and a second lead coupled to fourth port 40. First 32, second 34 and third 36 capacitors each have capacitance C given as $C=(2 \cdot Z_o \cdot Z_1)^{-0.5} \omega_o$, where $\omega_o$ is a nominal center radian frequency of coupler 14. Third inductor 35 has an inductance L given by $L=(2 \cdot Z_o \cdot Z_1)^{0.5} \omega_o$ and first 31 and second 33 inductors each have inductances of one-half of inductance L.

Figure 2:
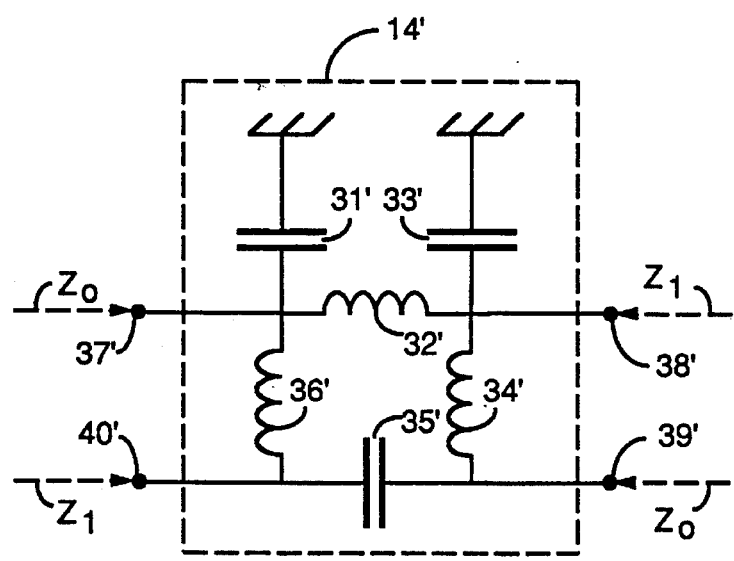
FIG. 2 is a schematic diagram of a second embodiment of a lumped element four port coupler in accordance with the present invention.

FIG. 2 is a schematic diagram of a second embodiment of lumped element four port coupler 14' in accordance with the present invention. Four port coupler 14' is the dual of four port coupler 14 of FIG. 1 and comprises first port 37' adapted to match to first impedance $Z_o$, second port 38' adapted to impedance match to second impedance $Z_1$, third port 39' adapted to impedance match to first impedance $Z_o$ and fourth port 40' adapted to impedance match to second impedance $Z_1$.

Four port coupler 14' comprises first inductor 32' having a first lead coupled to first port 37' and a second lead coupled to second port 38', first capacitor 31 ' having a first lead coupled to first port 37' and a second lead coupled to ground, second capacitor 33' having a first lead coupled to second port 38' and a second lead coupled to ground, second inductor 34' having a first lead coupled to second port 38' and a second lead coupled to third port 39' third capacitor 35' having a first lead coupled to third port 39' and a second lead coupled to fourth port 40' and third inductor 36' having a first lead coupled to fourth port 40' and a second lead coupled to first port 37'. Third capacitor 35' has a capacitance C given as $C=(2 \cdot Z_o \cdot Z_1)^{-0.5} \omega_o$, where $\omega_o$ is a nominal center radian frequency of coupler 14', while first 31' and second 33' capacitors each have a capacitance of twice C. First 32', second 34' and third 36' inductors each have an inductance L given as $L=(2 \cdot Z_o \cdot Z_1)^{0.5} \omega_o$.

With respect to couplers 14, 14' of FIGS. 1, 2, respectively, first impedance $Z_o$ and second impedance $Z_1$ usefully are related such that one is more or less than the other and both correspond to real impedances (although loads attached to any of first through fourth ports may have pure real, complex or pure imaginary impedances). When loads having complex or pure imaginary impedances are employed, coupler performance is degraded. First impedance $Z_o$ and second impedance $Z_1$ typically differ in magnitude by a factor in the range of from 1.1 to 20, desirably in the range of from 1.2 to 10 with differences in magnitude by a factor of 1.25 to five being preferred.

Couplers 14, 14' are usefully realized as monolithic microwave integrated circuits comprising spiral inductors (e.g., inductors 31, 33, 35, 32', 34', 36') and thin-film capacitors (e.g., capacitors 32, 34, 36, 31', 33', 35'), together with ancillary elements (e.g., diodes, transistors, resistors etc.) as required to provide radio frequency circuits having small size and robust performance. In practice, couplers 14, 14' may include additional circuit elements or their functions and values for lumped-element equivalents (or other functional building blocks, e.g., transmission line lengths and/or geometries) are usually derived through use of optimization algorithms implemented in microwave design programs such as LIBRA, available from EEsof of Westlake Village Calif.

EXAMPLE I

A ring coupler of the type illustrated in FIG. 2 was designed to specifications given below in Table I, resulting in the component values provided in Table II.

TABLE I

Design parameter values for the experimental lumped element impedance transforming ring coupler of FIG. 2.

| PARAMETER | VALUE |
| --- | --- |
| $\omega_o/2\pi$ | 915 MHz |
| Input impedance | 50 Ω |
| Output impedance | 100 Ω |
| 20 dB isolation bandwidth | 200 MHz |
| Minimum return loss | 20 dB |

TABLE II

Values for elements 31'–36' for an impedance transforming ring coupler 14' (FIG. 2) having a 2:1 input to output impedance ratio.

| ELEMENT | VALUE |
|---------|--------|
| 31' | 7.0 pF |
| 32' | 8.7 nH |
| 33' | 7.0 pF |
| 34' | 8.7 nH |
| 35' | 3.5 pF |
| 36' | 8.7 nH |

The input impedance of Table I corresponds to impedances $Z_o$ associated with first 37, 37' and third 39, 39' ports of couplers 14, 14' of FIGS. 1, 2, respectively, while the output impedance of Table I corresponds to impedances $Z_1$ associated with second 38, 38' and fourth 40, 40' ports of couplers 14, 14' of FIGS. 1, 2, respectively.

Measured return losses were better than −15 dB over the design bandwidth with coupling losses of circa 4.8 to 5.2 dB. Thus, a simplified (i.e., having fewer circuit elements than employed in prior art couplers) impedance transforming ring coupler has been realized in compact, robust monolithic form well suited to cointegration with other components to realize communications subassemblies.

EXAMPLE II

Figure 3:
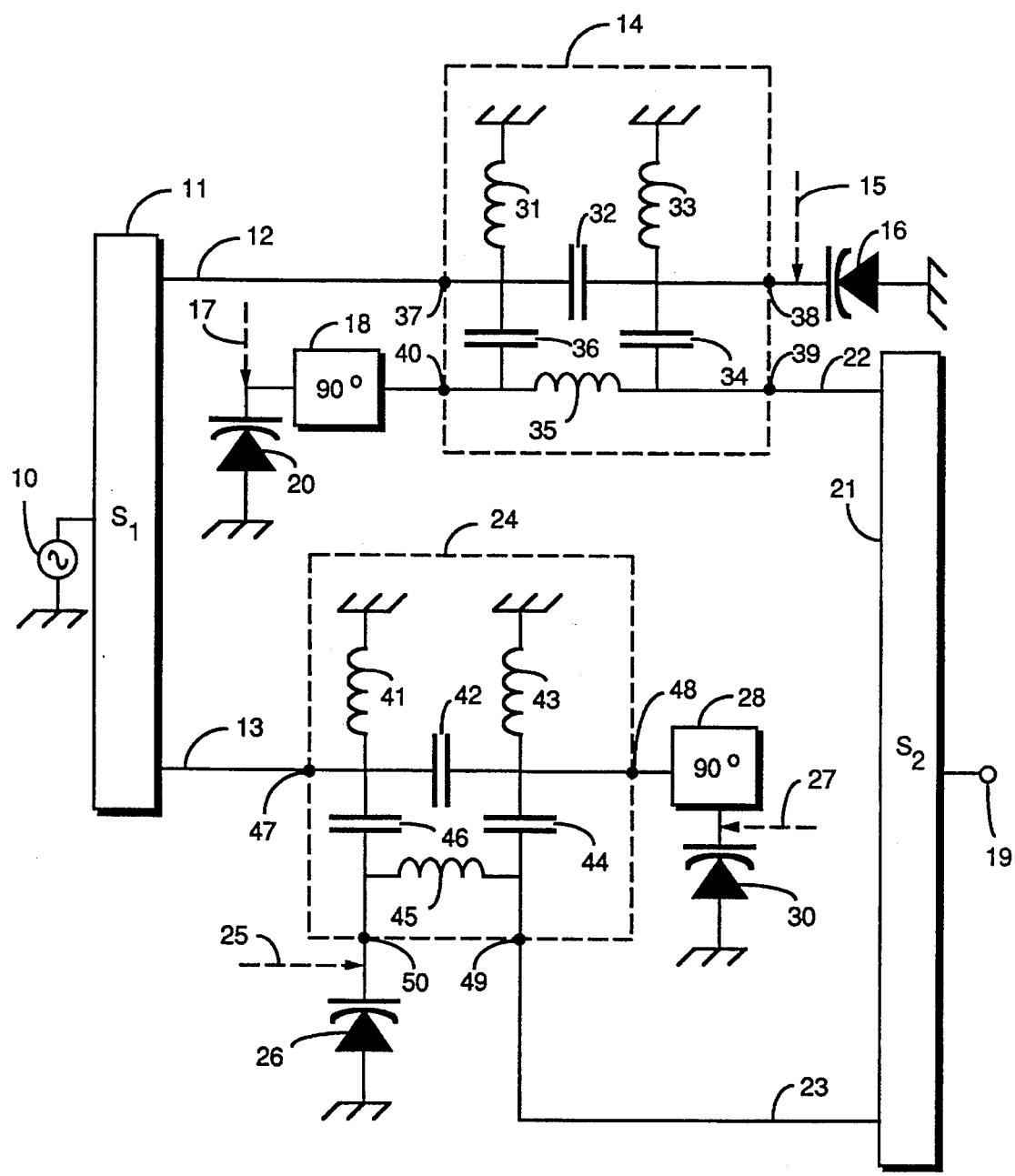
FIG. 3 is a simplified schematic diagram of a first biphase modulator employing a four port coupler in accordance with the present invention.

FIG. 3 is a simplified schematic diagram of a first biphase modulator 9 employing a four port coupler in accordance with the present invention. Biphase modulator 9 usefully comprises single-pole double-throw (SPDT) input switch 11 ($S_1$) having an input coupled to signal source 10 for providing a signal to be modulated. Input switch 11 includes outputs 12, 13 coupled to first ports 37, 47 of couplers 14, 24, respectively.

Couplers 14, 24, are conveniently realized as lumped element couplers as described by FIGS. 1, 2 and associated text. Biphase modulator 9 also includes electronically variable reactance elements 16, 20, 26, 30 and phase shift networks 18, 28. Reactance element 16 is coupled to second port 38 of coupler 14, reactance element 20 is coupled to fourth port 40 of coupler 14 via 90° phase shift network 18, while reactance element 26 is coupled to fourth port 50 of coupler 24 and reactance element 30 is coupled to second port 48 of coupler 24 via 90° phase shift network 28. This antisymmetric arrangement (i.e., reversing the roles of second 38, 48 and fourth 40, 50 ports of couplers 14, 24, respectively) provides signals at third ports 39, 49 having a nominal 180° degree phase difference when reactance elements 16, 20, 26, 30 all have identical impedances.

Output switch 21 ($S_2$) is usefully an SPDT switch and includes input 22 coupled to third port 39 of coupler 14, input 23 coupled to third port 49 of coupler 24 and output 9 for providing modulated output signals.

Input switch 11 and output switch 21 are electronically toggled in synchronism (i.e., collectively function as a double-pole, double-throw switch) to select either a first signal path comprising coupler 14 and associated phase shift elements 16, 18, 20 or a second signal path comprising coupler 24 and associated phase shift elements 26, 28, 30. The first and second signal paths include different phase shifts selected through electronic adjustment of electronically variable reactance elements 16, 20, 26, 30, represented in FIG. 3 as varactor diodes.

Electronically variable reactance elements 16, 20, 26, 30 usefully include DC bias networks (not illustrated), represented as dashed lines 15, 17, 25, 27, respectively, for effecting electronic adjustment of the net phase shifts of the first and second signal paths over a first frequency range via adjustment, independent or in tandem, of each of the reactances of electronically variable reactance elements 16, 20, 26, 30 in response to low frequency control signals coupled to electronically variable reactance elements 16, 20, 26, 30 via DC bias networks 15, 17, 25, 27, respectively. Typically, the low frequency signals alter the degree of reverse bias of varactor diodes 16, 20, 26, 30, thereby modifying the capacitance and hence the reactance thereof. Input switch 11 and output switch 21 are usefully realized as FET switching circuits, desirably as a high input-output isolation switch.

Couplers 14, 24 advantageously comprise lumped element ring couplers providing one-fourth of a wavelength phase shift (i.e., 90° at the nominal center radian frequency) between three adjacent pairs of ports and three-fourths of a wavelength phase shift (i.e., 270°) between the remaining two adjacent ports (i.e., across inductors 35, 45).

Applicants have discovered that it is particularly useful to employ ring couplers adapted to provide impedances of $Z_o$ (a characteristic impedance of the environment in which biphase modulator 9 operates; signal source 10 and output 19 typically are matched to impedances equal to $Z_o$) at first 37, 47 and third 39, 49 ports (i.e., ports coupled to switches 11, 21) and adapted to provide a second impedance $Z_1$ at second 38, 48 and fourth 40, 50 ports (i.e., ports coupled to reactance elements 16, 20, 26, 30). This arrangement simplifies circuit design, provides a less complex circuit involving fewer components and may be implemented in a more compact form than circuits employing separate impedance matching circuits for coupling reactance elements 16, 20, 26, 30 to couplers 14, 24.

Monolithic implementation of biphase modulator 9 (e.g., as a GaAs monolithic microwave integrated circuit or MMIC) avoids having to select reactance elements 16, 20, 26, 30 having matched properties because monolithically realized circuits tend to provide elements having properties that are all affected in the same way by some types of manufacturing variations. Reduction of losses typically associated with separate matching networks is another benefit of this arrangement. Use of impedance transforming ring couplers for couplers 14, 24 provides good input and output impedance matching over the desired bandwidth for all bias values for electronically variable reactance elements 16, 20, 26, 30 and interchanging the ports including phase shift networks 18, 28 eliminates need for a 180° phase shift in combining the signals from the first and second signal paths. Use of electronically variable reactance elements 16, 20, 26, 30 allows analog adjustment of modulation angle not possible with other types of biphase modulators such as digital phase shifters.

A first modulator (FIG. 3) was monolithically implemented employing lumped-element equivalent values as given in Table III below through the foundry services of TriQuint Semiconductor.

TABLE III

| ELEMENT | VALUE |
|---|---|
| \multicolumn{2}{Element values for the tunable biphase modulator.} |
| 31 | 1.0 nH |
| 32 | 0.46 pF |
| 33 | 0.69 nH |
| 34 | 0.55 pF |
| 35 | 1.84 nH |
| 36 | 0.33 pF |
| 41 | 1.0 nH |
| 42 | 0.31 pF |
| 43 | 0.88 nH |
| 44 | 0.38 pF |
| 45 | 1.9 nH |
| 46 | 0.42 pF |

This modulator provides roughly sixty degrees of tuning range via biases applied to reactance elements 16, 20, 26, 30, realized as varactor diodes. In the test circuit, DC bias networks 25, 27, corresponding to reactance elements 26, 30, were grounded and DC bias networks 15, 17 were fed by a common control line having a control signal voltage of 0 to −2 volts. This modulator employed GaAs MESFET switches (arranged in a series-shunt-shunt configuration) for first and second switches 11, 21. Channel widths of 250 micrometers and 150 micrometers were employed for the series and shunt FETs, respectively, and 0.3 nH inductors couple the switch sections together.

The exemplary modulator maintains a measured 0.5 dB amplitude balance between the first and second signal path signals over a 10% fractional bandwidth when the first and second signal paths are set, through DC signals directed to electronically variable reactance elements 16, 20, 26, 30 via DC bias networks 15, 17, 25, 27, respectively, to maintain a phase difference between the first and second paths of 172 degrees. The component values provided in Table III were chosen to accommodate impedance variations of electronically variable reactance elements 16, 20, 26, 30 with bias while maintaining the close amplitude balance desired for biphase modulator 9.

This example provides roughly 60 degrees of phase shift change when the control voltage coupled to one pair of variable reactance elements 16, 20 and 26, 30 is varied over the range 0 to −2 volts together with a measured 0.5 dB amplitude balance over a 10% fractional bandwidth about a nominal center radian frequency $\omega_o$. Thus, tunable biphase modulator 9 has been described which overcomes specific problems and accomplishes certain advantages, relative to prior art methods and mechanisms, through use of lumped element impedance transforming ring coupler 14 as described in FIGS. 1, 2 and associated text.

EXAMPLE III

FIG. 4 is a simplified schematic diagram of a second biphase modulator 9' employing four port coupler 14 in accordance with the present invention. Biphase modulator 9' usefully comprises coupler 14 having first port 37, second port 38, third port 39 and fourth port 40, with first port 37 of coupler 14 coupled to signal source 10, which provides a signal to be modulated by biphase modulator 9'. First port 37 acts as an input to biphase modulator 9' while third port 39 is coupled to output 22'.

Second port 38 is coupled to 90° phase shift network 18 and thereby to the combination of switch 19" and reactance element 16 while fourth port 40 is coupled to switch 19' and thereby to reactance element 20. Switches 19', 19" operate together in synchronism, i e , when switch 19' is in a conducting state, switch 19" is in a conducting state and vice versa. When switches 19', 19" are open they represent impedances nominally 180° different than reactance elements 16, 20. Biphase modulation of signals from signal source 10 is effecting by coupling a modulating signal (and/or the complement thereof) to switches 19', 19" to cause switches 19', 19" to change state in synchronism.

It will be appreciated that other electronically alterable phase shift elements (e.g., FETs etc.) may be employed for electronically variable reactance elements 16, 20 or that phase shift elements of fixed value may be employed when electronic adjustment is not required. In the general case, electronically variable reactance elements 16, 20 include DC bias networks (not illustrated), represented as dashed lines 15, 17, respectively, allowing electronic adjustment of the net phase shifts provided by reactance elements 16, 20, respectively, over a first frequency range through independent adjustment of the reactances of electronically variable reactance elements 16, 20 in response to low frequency control signals coupled to electronically variable reactance elements 16, 20 via DC bias networks 15, 17, respectively. Typically, the low frequency signals alter the degree of reverse bias of varactor diodes 16, 20, thereby modulating the capacitance and hence the reactance thereof.

Coupler 14 is advantageously a ring coupler realized in lumped element form. Applicants have discovered that significant advantages accrue when coupler 14 is designed to impedance match to a first characteristic impedance $Z_o$ at first 37 and third 39 ports, respectively, when second 38 and fourth 40 ports are terminated in different impedances $Z_R$ associated with reactance elements 16, 20, switches 19', 19" and phase shift network 18 Further, components comprising 90° phase shift network 18 may be subsumed within or combined with components comprising coupler 14, providing reduced element count, promoting higher yields when fabricated in monolithic form and simplifying design, layout and analysis of biphase modulator 9'.

A modulator was monolithically implemented employing lumped-element equivalent values as given in Table IV below through the foundry services of TriQuint Semiconductor.

TABLE IV

| ELEMENT | VALUE |
|---|---|
| 31 | 0.81 nH |
| 32 | 0.45 pF |
| 33 | 0.81 nH |
| 34 | 0.46 pF |
| 35 | 1.64 nH |
| 36 | 0.60 pF |

This modulator provides roughly twenty degrees of tuning range via biases applied to reactance elements 16, 20, realized as varactor diodes having a 300 micrometer periphery. In the test biphase modulator circuit, DC bias networks 15, 17 were provided with independent control signal voltages of 0 to −2 volts. This modulator employed GaAs MESFET switches for switches 19', 19" Each switch 19', 19" comprises a series FET in series with reactance element 16 or 20 and a 1.43 nH inductor coupled from source to drain of the series FET (i.e., in shunt therewith) Each switch 19', 19" also comprises a shunt FET coupled in shunt with node 38 or 40 and a 2.0 nH inductor coupled in shunt with the shunt FET. The switch arrangement comprising switches 19', 19" requires only four FETs, providing high performance in a small footprint. 90° phase shift network 18 is conveniently realized as a 0.72 pF capacitor coupled from fourth port 40 to ground and a 1.42 nH inductor coupled between fourth port 40 and switch 19".

The exemplary modulator maintains a measured 0.3 dB amplitude balance between the first and second switch state signals over a 10% fractional bandwidth when the first and second switch states are set, through DC signals directed to electronically variable reactance elements 16, 20 via DC bias networks 15, 17, respectively, to maintain a phase difference between the first and second switch states of 172 degrees. The component values provided in Table IV were chosen to accommodate impedance variations of electronically variable reactance elements 16, 20 with bias while maintaining the close amplitude balance desired for biphase modulator 9' together with continuous adjustability of the modulation angle between the two phase states of biphase modulator 9'.

This example provides roughly twenty degrees of phase shift change when the control voltage coupled to variable reactance elements 16, 20 is varied over the range 0 to −2 volts. Thus, tunable biphase modulator 9' has been described which overcomes specific problems and accomplishes certain advantages relative to prior art methods and mechanisms, relative to prior art methods and mechanisms, through use of lumped element impedance transforming ring coupler 14 as described in FIGS. 1, 2 and associated text.

The expense, complexities and high parts count of modulators assembled from discrete components are avoided. Similarly, fabrication in monolithic form facilitates achieving balanced structures (i.e., similar reactance elements 16, 20) required to provide close control of the phase difference and the amplitude balance in the modulated signal, while simultaneously providing very small form factor, light weight and robust circuitry.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A four port coupler comprising:

a first port having a first impedance $Z_o$;

a second port having a second impedance $Z_1$, wherein said first impedance $Z_o$ is related to said second impedance $Z_1$ by a factor in the range of from one and one half to ten;

a third port having said first impedance; and a fourth port having said second impedance;

a first inductor having a first lead coupled to said first port and a second lead coupled to ground;

a first capacitor having a first lead coupled to said first port and a second lead coupled to said second port;

a second inductor having a first lead coupled to said second port and a second lead coupled to ground;

a second capacitor having a first lead coupled to said second port and a second lead coupled to said third port;

a third inductor having a first lead coupled to said third port and a second lead coupled to said fourth port; and a third capacitor having a first lead coupled to said first port and a second lead coupled to said fourth port.

2. A coupler as claimed in claim 1, wherein said first, second and third capacitors each have a capacitance C given as:

$$C = (2 \cdot Z_o \cdot Z_1)^{-0.5} \omega_o,$$

wherein $\omega_o$ is a nominal center radian frequency of said coupler.

3. A coupler as claimed in claim 1, wherein said third inductor has an inductance L given as:

$$L = (2 \cdot Z_o \cdot Z_1)^{0.5} \omega_o,$$

wherein $\omega_o$ is a nominal center radian frequency of said coupler.

4. A coupler as claimed in claim 1, wherein said first and second inductors have inductance of one-half of said inductance L of said third inductor.

5. A coupler as claimed in claim 4, wherein said coupler comprises a monolithic circuit.

6. A four port coupler comprising:

a first port having a first impedance $Z_o$;

a second port having a second impedance $Z_1$, wherein said first impedance $Z_o$ is related to said second impedance $Z_1$ by a factor in the range of one and one half to ten;

a third port having said first impedance; and a fourth port having said second impedance;

a first inductor having a first lead coupled to said first port and a second lead coupled to said second port;

a first capacitor having a first lead coupled to said first port and a second lead coupled to ground;

a second capacitor having a first lead coupled to said second port and a second lead coupled to ground;

a second inductor having a first lead coupled to said second port and a second lead coupled to said third port;

a third capacitor having a first lead coupled to said third port and a second lead coupled to said fourth port; and a third inductor having a first lead coupled to said fourth port and a second lead coupled to said first port.

7. A coupler as claimed in claim 6, wherein said third capacitor has a capacitance C given as:

$$C=(2 \cdot Z_o \cdot Z_1)^{-0.5} \omega_o,$$

wherein $\omega_o$ is a nominal center radian frequency of said coupler.

8. A coupler as claimed in claim 7, wherein said first and second capacitors have a capacitance of twice said capacitance C of said third capacitor.

9. A coupler as claimed in claim 6, wherein said first, second and third inductors have an inductance L given as:

$$L=(2 \cdot Z_o \cdot Z_1)^{0.5}/\omega_o,$$

wherein $\omega_o$ is a nominal center radian frequency of said coupler.

10. A coupler as claimed in claim 9, wherein said coupler comprises a monolithic circuit.

* * * * *